United States Patent [19]

Holdsworth

[11] Patent Number: 4,845,447
[45] Date of Patent: Jul. 4, 1989

[54] VIDEO FILTER ASSEMBLY
[75] Inventor: Timothy M. Holdsworth, Clay, N.Y.
[73] Assignee: Northeast Filter Co., Inc., East Syracuse, N.Y.
[21] Appl. No.: 272,789
[22] Filed: Nov. 18, 1988
[51] Int. Cl.⁴ .......................... H03H 7/01; H03H 1/00
[52] U.S. Cl. ...................................... 333/167; 333/12; 333/185; 174/52.1
[58] Field of Search .......... 333/12, 167, 168, 174–179, 333/181–185; 361/399, 406; 174/50, 51, 52.1, 50.52

[56] References Cited

U.S. PATENT DOCUMENTS

| | | | |
|---|---|---|---|
| 1,557,229 | 10/1925 | Zobel | 333/168 |
| 3,522,485 | 8/1970 | De Metrick | 361/399 |
| 3,644,848 | 2/1972 | Kruczek | 333/185 |
| 4,015,070 | 3/1977 | Theurer | 174/52.1 |
| 4,152,671 | 5/1979 | Tuma et al. | 174/52.1 |
| 4,159,506 | 6/1979 | Latasiewicz et al. | 361/399 |
| 4,451,803 | 5/1984 | Holdsworth et al. | 333/12 |
| 4,701,726 | 10/1987 | Holdsworth | 333/185 |
| 4,749,972 | 6/1988 | Schulz et al. | 333/185 X |

Primary Examiner—Marvin L. Nussbaum
Attorney, Agent, or Firm—Wall and Roehrig

[57] ABSTRACT

A trap filter assembly of the type employed with a video cable system to block a particular band of video frequencies has a housing formed as a generally rectangular block of square cross-section, made of cast aluminum or other suitable material. A cavity formed in the housing has first and second compartments which are separated from one another by a pair of barrier walls that define therebetween a channel passageway that extends from one corner of the first cavity compartment to a laterally opposite corner of the second cavity compartment. This prevents any direct line of sight signal path for stray video signals between the first and second compartments. First and second printed circuit filter boards are mounted in the compartments, preferably by a threaded fastener which mounts the boards onto respective pedestals in the compartments. A bare-braid coax conductor passes through the channel between the barrier walls and unites the signal paths on the two boards in the respective compartments. A cover or closure plate of a suitable conductive material closes off the access opening to the cavity. The male connector preferably has a rotatable threaded sleeve. This filter trap assembly can be installed in an on-premise enclosure. Signal degradation is reduced by half.

22 Claims, 1 Drawing Sheet

VIDEO FILTER ASSEMBLY

BACKGROUND OF THE INVENTION

This invention relates to video filters, and is more particularly directed to trap filters or blocking filters of the type that are employed in a cable video system. These filters are typically employed either to block a premium or pay channel but to pass other channels, or to block out a narrow band of frequencies from within a particular video channel where single or multiple scrambling signals have been injected into a pay television channel.

A critical requirement of these filters is that they be factory tuned to reject or pass specific signals, and that they have a high degree of stability and reliability in the outdoor operating environment. It is a further requirement that these filters be economical to construct and that precise tuning to the proper frequency be easy to carry out.

Current state-of-the-art video filters commonly have an attenuation of approximately 75–80 dB at the center frequency of their filter notch. However, it has long been desired in the industry to obtain an attenuation of 90 dB or better, so that the pay channel is passed with a minimum of signal degradation. State-of-the-art video trap filters are described, e.g., in U.S. Pat. Nos. 4,701,726 and 4,451,803.

It is also desired that any filter assemblies be compatible both with the conventional on-pole placement, (i.e., off the customers premises), and also with the on-premises enclosure that has become a current trend in the cable industry. In the latter case, the traps, filters, signal splitters and the like would be located on the customer's premises, rather than on a pole, and the video signals could be split to serve more than one set in the customer's home. A typical family can have two or more television sets, and some family members may want to watch different types of programming, such as news and sports, at the same time.

The off-pole, on-premise enclosure permits a new geometry to be employed for the traps, because it is possible to avoid the port-to-port round-shape restriction imposed on the earlier traps. With alternative geometries it is possible for the on-premise-enclosure traps to pass signals that are much sharper.

At the same time, any traps of new design should be simple to construct, tune, and seal, and should not employ an unusually large number of parts.

OBJECTS AND SUMMARY OF THE INVENTION

Accordingly, it is an object of this invention to provide an improved video filter or trap which has significantly reduced signal degradation as compared with existing traps.

It is another object of this invention to provide a trap which is simple to construct and to install.

It is another object of this invention to provide a video trap which is compatible with on-premise enclosures.

In accordance with an aspect of this invention, a filter assembly for a video trap filter device can be fine-tuned to attenuate a selected band of video frequencies, and then is sealed moisture-tight. A housing is preferably formed of cast aluminum as a rectangular block of square cross-section, with first and second square ends and with coaxial connectors situated at the centers of the first and second ends. A cavity is formed within the housing as first and second cavity portions or compartments, each compartment being adjacent the respective first end or second end. The cavity has an access opening through one side wall of the housing. The housing also has a pair of barrier walls that traverse the cavity between the first and second compartments of the cavity, and define between them a channel passage way that extends from one corner of the first compartment to a laterally opposite corner of the second compartment. The barrier walls prevent any direct line of sight signal path for stray video signals between the first and second compartments. First and second printed circuit filter boards are mounted respectively in the first and second compartments. Each has at least one tunable impedance device, such as a tunable coil, a ground conductive area to contact electrically with the housing, and a signal conductor that communicates with a respective one of the coaxial connectors and with the tunable impedance device. An insulated conductor, preferably a barebraid coaxial cable, passes through the channel passageway and connects the signal conductors of the first and second boards. A closure plate of a conductive material closes off the opening in the side wall. The cavity is then filled with a plastic foam material, e.g. foamed urethane, to preclude moisture from entering the device, and the tuning coils are fine tuned to a precise frequency. Finally, sealing means close off the closure plate.

Preferably, the boards are mounted on pedestals in each compartment by means of a threaded connector. One of the coaxial connectors can be a male connector which has a rotatable threaded sleeve. This permits connection of the device without having to rotate the entire housing.

It has been found that this construction has only half the signal degradation of the best available round or tubular video traps. This is believed to be a result of the superior Q factor of the inductors due to the increase in internal compartment size over conventionll tubular filters or traps. filter or trap is also exceptionally easy to construct because all parts are inserted through the rather large side opening. Tuning, foam filling, and sealing are rather easy to effect, without expensive or complicated equipment. In addition, the price per unit of the materials for these traps is reduced, because inexpensive materials, such as cast aluminum, can be employed instead of the rather expensive nickel-plated brass that is now required. Also, while cast aluminum is the material of choice at the present time, it is possible that devices could be molded of highly conductive thermosetting plastic resin material, or other suitable materials.

The above and many other objects, features, and advantages of this invention can be more fully appreciated from the ensuing description of a preferred embodiment, which should be read in connection with the accompanying Drawing.

DETAILED DESCRIPTION OF THE PREFERRED EMBODIMENTS

Figure 1:
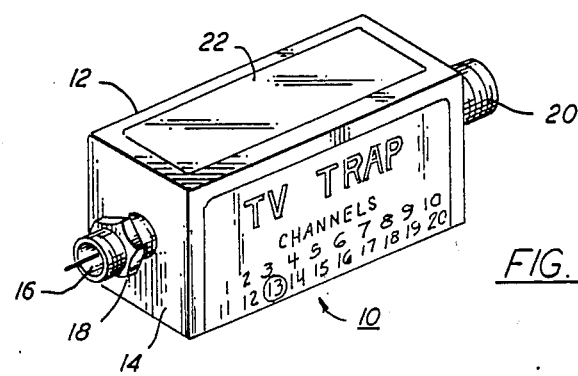
FIG. 1 is a perspective view of a video trap filter according to a preferred embodiment of this invention.
Figure 2:
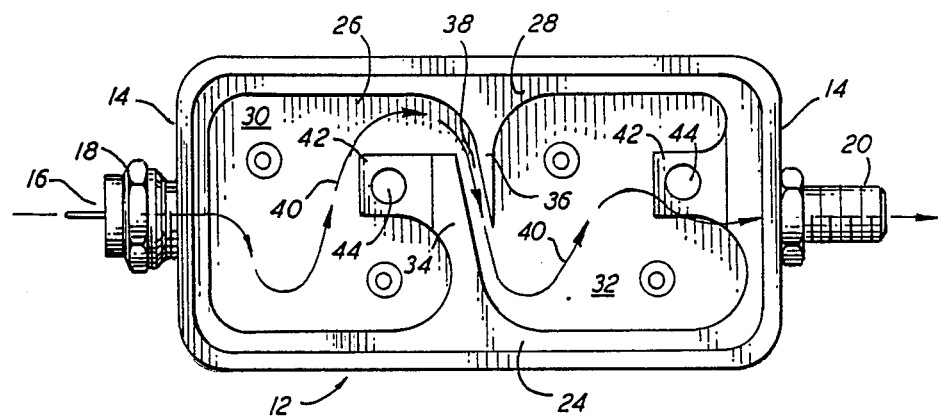
FIG. 2 is a top plan view of the housing of the filter of this embodiment.
Figure 3:
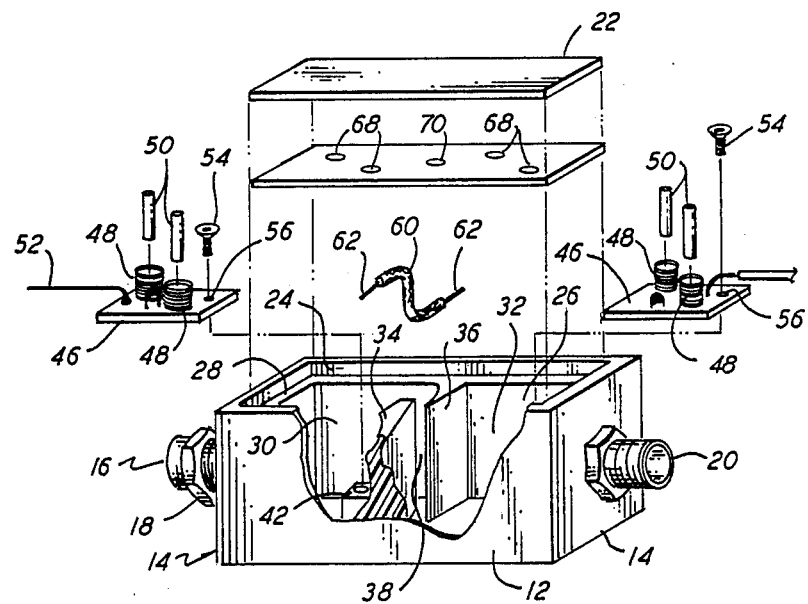
FIG. 3 is an exploded view showing the construction of the filter trap of this embodiment.

FIGS. 1-3 of the Drawing show a filter assembly 10, which can be, for example, a positive or a negative trap. The filter assembly has a case or housing 12 formed as a rectangular block of square cross section, and cast of aluminum alloy or another suitable metal or other conductive material. The block shown here is about two inches long, and one inch in width and breadth. The rectangular-block housing 12 has square ends 14, with a male coaxial connector 16 centered at one end 14. To facilitate installation, this connector 16 has a rotatable, threaded sleeve 18, rather than a fixed sleeve which is typical of tubular trap assemblies. A female connector 20 is situated at the center of the opposite square end 14. A closure plate 22 is shown in FIG. 1 to be welded or otherwise secured onto one side of the housing 12. The plate 22 is apertureless and closes off an opening 24 that leads into a cavity 26 within the housing, as shown in FIGS. 2 and 3. The opening 24 has an annular shouldered recess 28, in which the closure plate reposes.

The cavity 26 is divided into a first compartment 30 and a second compartment 32, which are each generally rectangular and which extend respectively from the male and female ends 14 of the filter to a center of the housing 12. A first barrier wall 34 extends from one side wall of the cavity 26 across the housing axis to define a rear wall of the first compartment 30, while another barrier wall 36 extends from the other side wall of the cavity 26 across the housing axis at the back of the second compartment 32. These barrier walls traverse the center of the cavity 26, and are spaced a small distance from one another so as to define a passageway or channel 38 that communicates from one corner of the first compartment 30 to a laterally opposite corner of the second compartment 32.

As shown in FIG. 2, this construction creates a tortuous signal path 40 which avoids any direct line of sight pathway into either one of the compartments for radiation that may emanate in the other compartment.

As also shown in FIG. 2, a pedestal 42 is provided in each of the compartments 30 and 32. This pedestal extends upwards a short distance towards the opening 24, and has a threaded bore 44 in a flat top surface thereof. The pedestals 42 serve as supports for mounting printed circuit boards 46, as shown in FIG. 3. There are two generally rectangular printed circuit boards provided, one board 46 for each compartment 30,32. The boards are each two-pole boards, with a pair of tuning coils 48 situated at corners away from the entrance to the channel 38. Tuning slugs 50, each with a tubular plastic sleeve, are inserted into the coils 48. A signal lead 52 contacts the center conductor of the respective connector 16, 20 and carries the video signal to the tuning coils 48 as well as to other impedance components. A pair of screws 54 fit through a respective hole in each board 46 to hold the same down against the respective pedestal 42 in each compartment 30 or 32. A grounding pad 56 at the location of the hold-down screw 54 ensures good grounding contact between the housing 12 and the board 46.

The two boards 46 are connected together by a coaxial jumper or conductor 60 which carries the signal from the board 46 in the first compartment 30, through the channel 38 between the barrier walls 34 and 36, to the board 46 in the second compartment 32. The coaxial jumper has a bare braid over an insulated sleeve, and preferably the braid contacts the barrier walls 34 and 36 as it passes through the passageway 38. Optionally, the braid can be grounded to the grounding pads 56 at each end. The center conductor 62 of the coaxial jumper unites the signal paths on the two boards 46.

A closure plate 66 is placed onto the shoulder 28 within the access opening 24 once the aforementioned components are installed within the housing 12. The closure plate 66 can simply snap into place, can be tack welded, or can be held by temporary fastening means. In some embodiments, a threaded fastener can be employed. Access openings 68 are provided in the closure plate 66 for tuning the slugs 50, and another opening 70 is provided for injection of foamed plastic.

After the device has been foamed and tuned, the outer closure plate 22 is installed over the lower closure plate 66, and is hermetically sealed, for example, by a suitable welding technique. In this preferred embodiment, the tuning is carried out on a straight-through basis, using a sensitive frequency analyzer.

In other alternative embodiments, rather than having separate upper and lower closure plates 22 and 66, it is possible to seal the openings 68 and 70 with a solder, or with a thermosetting or epoxy resin.

In other alternative arrangements, the barrier walls 34 and 38 could be configured differently, so long as they avoid having a direct line of sight signal path between the two compartments. Moreover, a filter or trap having three or more compartments could also be constructed, employing the same principles as described in connection with the above-described embodiments.

Moreover, the invention is not limited to traps and filters of square cross section, as traps may well have housings of other non-round shapes.

While the present invention has been described in detail with respect to certain preferred embodiments, it should be understood that the invention is not limited to those precise embodiments. Rather, many modifications and variations would present themselves to those skilled in the art without departing from the scope and spirit of this invention, as defined in the appended claims.

What is claimed is:

1. A filter assembly for a video trap filter device of the type which is fine tuned to attenuate a selected band of video frequencies and then is sealed moisture tight, comprising:

a housing formed of a conductive material and having first and second ends and at least one side wall, with electrical connectors situated in said first and second ends, and a cavity formed within said housing as first and second cavity portions each adjacent said first and second ends, the cavity including an access opening through said side wall, the housing including a pair of spaced barrier walls that traverse said cavity between said first and second cavity portions and define therebetween a channel passageway that extends from one corner of the first cavity portion to a laterally opposite corner of the second cavity portion, said barrier walls preventing any direct line-of-sight signal path for stray video signals between the first and second cavity portions;

first and second printed circuit filter boards each having at least one tunable impedance device thereon, a ground conductive area to contact electrically with said housing, and a signal conductor communicating with a respective one of said connectors and with said tunable impedance device, each said printed circuit filter board being mounted within the respective one of said first and second cavity portions;

an insulated conductor which passes through said channel passageway and connects the signal conductors of said first and second boards; and cover means of a conductive material for closing off said opening in said side wall.

2. The filter assembly of claim 1 wherein said housing is of non-round cross section.

3. The filter assembly of claim 1 wherein one of said connectors is a male coaxial connector with a rotatable threaded sleeve.

4. The filter assembly of claim 1 wherein said housing further includes first and second mounting pedestals formed respectively in said cavity portions opposite said access opening, and having a threaded opening thereon for mounting the respective board by means of a threaded fastener.

5. The filter assembly of claim 1 wherein said barrier walls are unitarily formed with said housing.

6. The filter assembly of claim 1 wherein said housing is cast of an aluminum alloy.

7. The filter assembly of claim 1 wherein said insulated conductor is a coaxial cable having a center conductor, an insulator, and a bare conductive braid over said insulator.

8. The filter assembly of claim 7 wherein said conductive braid is in electrical contact with said walls and is also connected at each end to the ground conductive area of the first and second boards.

9. The filter assembly of claim 1 wherein each said board is generally rectangular and each said cavity portion is likewise generally rectangular.

10. The filter assembly of claim 1 wherein on each said board said at least one tunable impedance device includes a pair of tunable coils disposed on diagonally opposite corners of said board, wherein neither coil is adjacent to the corner of the cavity portion to which the channel passageway connects.

11. The filter assembly of claim 1 wherein said cover means includes a cover plate which snap fits into a recess in said access opening, said plate having at least two openings over each of said cavity portions through which the at least one tunable impedance can be adjusted.

12. The filter assembly of claim 11 wherein said cover means further includes an apertureless plate which fits into the access opening over the first-mentioned cover plate.

13. A cast or molded housing for use in a video filter assembly of the type that is fine tuned to attenuate a selected band of video frequencies and is then sealed moisture tight; said housing including a rectangular block of cast or molded conductive material having a square cross-section and square ends, a cavity in said housing with an access opening that extends along one side wall of the housing, the cavity being formed as first and second cavity portions that extend generally from respective ends axially to a center of the block, a pair of transverse barriers at the center of the block to divide said first and second cavity portions from one another, said barriers defining therebetween a channel passageway that extends transversely to connect one corner of each of the cavity portions with a laterally opposite corner of the other cavity portion; and a pair of electrical connectors respectively disposed at centers of the end walls.

14. The filter housing of claim 13 wherein said barriers extend from opposite side walls of said cavity across the axis or the housing.

15. The filter housing of claim 13 wherein said cavity has a shouldered recess at said access opening into which a closure plate is fitted.

16. The filter housing of claim 13 wherein said block is cast aluminum alloy.

17. The filter housing of claim 13 further comprising a mounting pedestal within each said cavity portion on which a respective circuit board is supported.

18. The filter housing of claim 17 in which each said pedestal has a flat upper surface with a threaded opening therein for securing said circuit board thereto by means of a threaded fastener.

19. A filter assembly for a video trap filter device of the type which is fine tuned to attenuate a selected band of video frequencies and then is sealed moisture-tight, comprising:

a housing formed of a conductive cast or molded material and having first and second ends and at least one side wall with electrical connectors situated in said first and second ends and a cavity formed within said housing including an access opening through said side wall, and barrier means disposed across said cavity substantially midway between said ends for dividing the cavity into first and second compartments, said barrier means being formed of a conductive material to block r.f. radiation emanating in one of the compartments from passing to the other compartment, said barrier means having a passageway formed therethrough between said compartments which avoids a direct line of sight radiation pathway between said compartments;

first and second printed circuit filter boards each having at least one tunable impedance device thereon, a signal conductor communicating with a respective one of said connectors and with the associated at least one tunable impedance device, each said printed circuit filter board being mounted within the respective one of said first and second compartments;

conductor means which passes through the passageway in said barrier means to connect the signal conductors of said first and second boards; and cover means of a conductive material for sealing off said access opening.

20. A filter assembly according to claim 19 in which said conductor means includes an insulated wire having an insulator and a bare conductive braid over said insulator, said braid being in contact with said barrier means at said passageway.

21. A filter assembly according to claim 19 wherein said housing is a generally rectangular block of generally square cross section.

22. A filter assembly according to claim 21 wherein said block is formed of cast aluminum alloy.

* * * * *

UNITED STATES PATENT AND TRADEMARK OFFICE
CERTIFICATE OF CORRECTION

PATENT NO. : 4,845,447
DATED : July 4, 1989
INVENTOR(S) : Timothy M. Holdsworth

It is certified that error appears in the above-identified patent and that said Letters Patent is hereby corrected as shown below:

Col. 6, line 7, "or" should read --of--.

Signed and Sealed this

Eighth Day of May, 1990

Attest:

HARRY F. MANBECK, JR.

*Attesting Officer*   *Commissioner of Patents and Trademarks*